United States Patent [19]

Thompson et al.

[11] 4,264,381

[45] Apr. 28, 1981

[54] FABRICATION OF INJECTION LASERS UTILIZING A POROUS HOST DIFFUSION LAYER

[75] Inventors: George H. B. Thompson, Sawbridgeworth; David F. Lovelace, Waltham Abbey, both of England

[73] Assignee: ITT Industries, Inc., New York, N.Y.

[21] Appl. No.: 80,355

[22] Filed: Sep. 28, 1979

Related U.S. Application Data

[62] Division of Ser. No. 886,235, Mar. 13, 1978, Pat. No. 4,203,079.

[30] Foreign Application Priority Data

Apr. 1, 1977 [GB] United Kingdom ............... 13972/77

[51] Int. Cl.³ .................. H01L 21/225; H01L 21/205
[52] U.S. Cl. .................. 148/175; 29/569 L; 29/580; 148/187; 148/188; 156/643; 204/32 S; 204/129.3; 204/129.65; 331/94.5 H; 357/17; 357/18; 357/56
[58] Field of Search ............... 148/175, 187, 188; 204/32 S, 129.3, 129.4, 129.6, 129.65; 357/18, 17; 331/94.5 H; 29/580, 569 L; 156/643

[56] References Cited

U.S. PATENT DOCUMENTS

| Re. 29,395 | 9/1977 | Yonezu | 148/175 |
|---|---|---|---|
| 3,982,265 | 9/1976 | Johnston | 204/32 S |
| 4,002,997 | 1/1977 | Thompson | 357/18 X |
| 4,011,113 | 3/1977 | Thompson et al. | 148/188 X |
| 4,016,505 | 4/1977 | Itoh et al. | 357/18 X |
| 4,105,955 | 8/1978 | Hayashi et al. | 331/94.5 H |
| 4,115,164 | 9/1978 | Jager et al. | 148/188 X |
| 4,128,815 | 12/1978 | Kawaguchi et al. | 357/18 X |
| 4,139,442 | 2/1979 | Bondur et al. | 148/175 X |
| 4,142,953 | 3/1979 | Lovelace | 204/129.4 X |
| 4,184,170 | 1/1980 | Burnham et al. | 357/18 X |

OTHER PUBLICATIONS

Dumke, W. P., "Simple Planar Double-Heterojunction Laser Structure", I.B.M. Tech-Discl. Bull., vol. 16, No. 4, Sep. 1973, p. 1186.
Dumke et al., "Double Heterojunction GaAr Injection Laser".
Ibid., vol. 15, No. 6, Nov. 1972, p. 1998.
Tsukada et al., "... Mesa-Stripe-Geometry ... Laser", Appl. Phys. Letters, vol. 20, No. 9, 1 May 1972, pp. 344-345.

*Primary Examiner*—L. Dewayne Rutledge
*Assistant Examiner*—W. G. Saba
*Attorney, Agent, or Firm*—John T. O'Halloran; Thomas N. Twomey

[57] ABSTRACT

Porous silica doped with zinc is used as a p-type dopant source in the construction of rib lasers. Other modifications include allowing the zinc diffusion to go right through the active layer and to dimension the device so that lateral optical guidance is unaffected by the rib.

25 Claims, 16 Drawing Figures

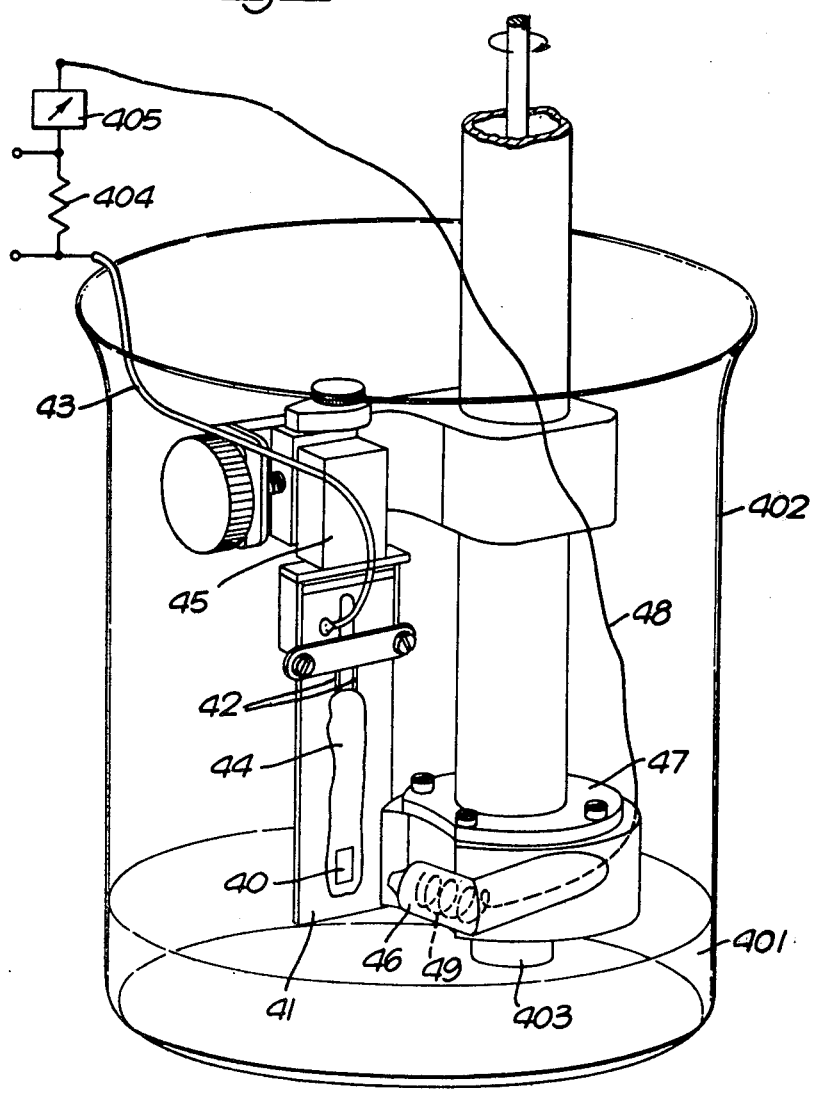

FABRICATION OF INJECTION LASERS UTILIZING A POROUS HOST DIFFUSION LAYER

This is a division, of application Ser. No. 886,235, filed Mar. 13, 1978, now U.S. Pat. No. 4,203,079 issued May 13, 1980.

This invention relates to double heterostructure lasers and in particular to modifications and improvements of the laser structures and manufacturing method described in the specification accompanying our U.S. Pat. No. 4,011,113 D. F. Lovelace 20-2).

That specification discloses a double heterostructure injection $Ga_{1-x}Al_xAs$ laser ($x \geq o$) with a rib under which a p-n junction has been caused to descend into an underlying n-type active layer sandwiched between two n-type layers of higher band-gap material. The p-n junction is caused to descend by the diffusion of a mobile p-type dopant such as zinc or magnesium.

In the structure as described the rib provides a measure of optical guidance in the lateral direction as a result of the close proximity of the active layer to the surface from which the rib protrudes. However, it will be appreciated that the shape of the underlying p-n junction provides a carrier concentration profile which also provides a measure of optical guidance in the lateral direction. It has now been found that adequate optical guidance in the lateral direction can be provided by this carrier concentration profile when the surface from which the rib protrudes is so far removed from the active layer that the contribution to optical guidance in the later direction provided by the rib is insignificant.

According to the present invention there is provided a double heterostructure injection laser of III-V material wherein the active region is formed in an active layer of lower band-gap material, which layer is sandwiched between upper and lower layers of higher band-gap material, all three layers having the same conductivity type, wherein overlying said active layer is a surface of the laser provided with a rib of material doped with a mobile dopant providing said rib with the opposite conductivity type to that of the three layers, which rib extends in the direction of the optical axis of the laser cavity frm one end face thereof to the other, wherein said dopant has been caused to translate the p-n junction that lies between the rib and the three layers downwardly into the active layer in that portion thereof underlying the rib, and wherein the rib is so far removed from the active layer that the contribution to optical guidance in the laser cavity in the lateral direction provided by the rib is insignificant.

In the specific embodiment of that earlier specification referred to previously the mobile dopant, zinc, was caused to translate the p-n junction downwardly into the active layer in the region underlying the rib. With this arrangement minority carrier injection across the p-n junction is confined virtually exclusively to the portion of the p-n junction lying in the active layer. This portion is a U-shaped channel, and injection occurs through both the bottom and the sides of the U. It has now been found that adequate carrier injection may still be provided when the downwards translation of the p-n junction takes it through the active layer and back into the higher band-gap material lying beneath. Under these circumstances, there is still minority carrier injection through the sides of the U, but now there is effectively no more through the base of the U. Normally the lasers are grown on a substrate of lower band-gap material which may have a lower band-gap than that of the active region. The downward translation of the p-n junction must be halted before it reaches into such lower band-gap material because, if it were allowed to penetrate into it, the region of penetration would provide a region of localised carrier injection operating in parallel with the region where carrier injection is required. Magnesium may be used in place of zinc as the mobile dopant, its mobility being significantly greater than for instance germanium.

According to the present invention there is provided a double interstructure injection laser of III-V material wherein the active region is formed in an active layer of lower band-gap material which layer is sandwiched between upper and lower layers of higher band-gap material, all three layers having the same conductivity type, wherein overlying said lower band-gap layer is a surface of the laser provided with a protruding rib with the opposite conductivity type to that of the three layers, which rib extends in the direction of the optical axis of the laser cavity from one end face thereof to the other, wherein said dopant has been caused to translate the p-n junction that lies between the rib and the three layers downwards through the active layer to come to a halt in said lower layer of higher band-gap material.

In the specific embodiment of the earlier specification previously referred to the mobile dopant, zinc, was incorporated in the device by incorporating it as a dopant in the epitaxial growth of one of the constituent $Ga_{1-x}Al_xAs$ layers of the device. When these layers are grown by liquid phase epitaxy some difficulty has been encountered because the zinc is liable to be rather more mobile under the conditions of epitaxial growth than later when it is to be diffused into the underlying material. This difference has been attributed to the fact that the Zn, as it diffuses during the epitaxial growth from the newly deposited layer into the n-type material beneath, is at first substantially trapped in substitutional sites as an acceptor, but once sufficient Zn is incorporated to convert the material to p-type, then the Zn moves relatively rapidly, under the conditions of epitaxial growth, deeper into the material to reach a further unconverted region. The process is continually repeated. Hence when the growth of the upper layer is complete most of the Zn which has diffused is trapped in substitutional sites and little excess remains which can be moved during a subsequent anneal. The same is true of magnesium. This problem may be circumvented by using a material other than a III-V semiconductor as a host for the mobile dopant source.

According to the present invention there is provided a method of making a double heterostructure injection laser of III-V material, the method including the steps of forming by epitaxial growth a double heterostructure with an active layer sandwiched between upper and lower layers of higher bandlgap material wherein all three layers have the same conductivity type, of depositing on the upper surface of the semiconductive material a porous host layer for a conductivity type determining dopant of the other type and of greater mobility than that used in the provision of the three layers of the double heterostructure, said porous layer being made of a material other an a III-V semiconductor, of diffusing said dopant into said porous layer, of selectively removing all of said porous layer, with the exception of a stripe, of selectively removing a surface region of the semiconductive material exposed by the selective removal of the porous layer so as to form a rib of semiconductive material underlying the stripe of porous material, of diffusing some of said dopant from the porous stripe into the underlying semiconductive material thereby provided a p-n junction that in the region underlying the rib has been translated into the active layer or through the active layer and into the lower layer of higher band-gap material, of removing the stripe of porous material, and of providing a top contact layer which selectively makes electrical contact with the exposed rib.

A feature of using a stripe of porous silica as the host for the dopant is that the stripe can also be used as a temporary mask for protecting the rib while the remainder of the top surface is covered with an electrically insulating anodised layer. The silica can then be selectively removed leaving only the rib exposed when a top electrical contact is provided.

In the foregoing frequent reference has been made to the active layer, and this has been identified as being made of lower band-gap material than that of the two layers between which the active layer is sandwiched. It should be noted however, that the active layer does not necessarily have the same composition throughout. In particular the active layer may itself be formed by a three layer structure comprising a central layer of low band-gap material, sandwiched between two layers of slightly higher band-gap material. All three layers of such an active layer are however made of material of lower band-gap than that of the higher band-gap layers between which the active layer is sandwiched. The use of a composite active layer of this type enables some separation of the functions of optical confinement and minority carrier confinement in the direction normal to the plane of the active layer. This is set out in greater detail in British patent specification No. 1,263,835 (G. H. B. Thompson 11) to which attention is directed.

There follows a description of the manufacture of double heterostructure $Ga_{1-x}Al_xAs$ injection lasers ($x \geq 0$) embodying the invention in the preferred forms. It should be clearly understood however, that the invention is not restricted to the $Ga_{1-x}Al_xAs$ system but is applicable to other semiconductors including other ternary compound semiconductors such as $Ga_{1-x}In_xAs$ and quaternary compound semiconductors such as $Ga_{1-x}In_xAs_{1-y}P_y$. The description refers to the accompanying drawings in which:

FIG. 4 depicts apparatus for electrochemical etching used in the process step described with particular reference also to FIG. 3c.

Figure 1A:
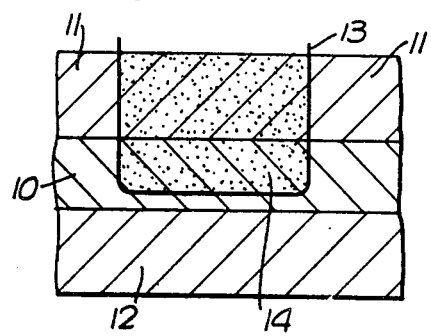
FIGS. 1a, 1b, 1c depict the central portion of three variants of double heterostructure laser.
Figure 1B:
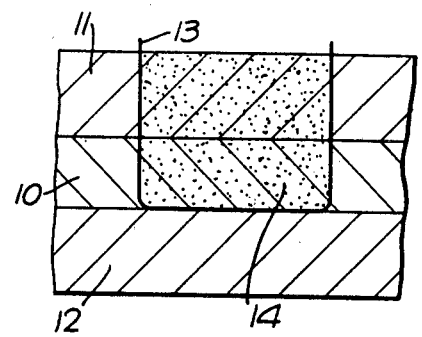
Figure 1C:
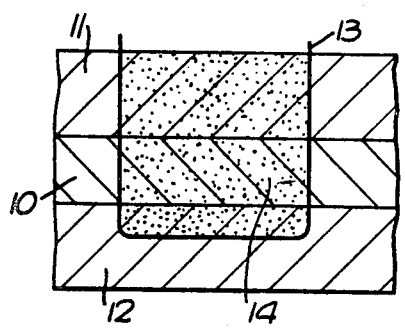

FIGS. 1a, 1b and 1c depict the central portion of three variants of lasers according to the present invention. Each has an active layer 10 of n-type lower band-gap $Ga_{1-x1}Al_{x1}As$ material, where $X_1 \geq 0$ sandwiched between upper and lower layers 11 and 12 of n-type higher band-gap $Ga_{1-x2}Al_{x2}As$ material, where $x_2 > x_1$. Into each of these structures zinc has been diffused along the stripe extending in the direction of the laser, and, by converting some of the originally n-type material into p-type material, this diffusion has produced a p-n junction 13. This p-n junction may extend only part of the way through the active layer, as in FIG. 1a; it may extend all the way through the active layer, as in FIG. 1b; or it may extend through the active layer and into, but not through, the lower layer 12, as shown in FIG. 1c. The zinc diffusion thus produces a stripe 14 of p-type material within the active layer. The p-n junction 13 is bounded on to one or both sides by the lower band-gap material where it lies at the boundary of the stripe 14. Elsewhere is bounded on both sides by higher band-gap material.

When such a device is forward biassed by a small amount, the current will flow across the junction almost exclusively through the region where it lies in the lower band-gap material. This is because the voltage drop across the p-n junction is smaller here than elsewhere. With increasing bias there may come the condition that the series resistance in the region of current flow produces a potential drop equal to the different in band-gap. When this occurs current will begin to flow across other parts of the junction if the resulting current flow is not subject to the same potential drop. Therefore within the region shown by the FIGS. 1a, 1b and 1c there is good current confinement at a small forward bias, but as the bias is increased the shape of the p-n junction may not alone be adequate to confine the current flow across the p-n junction to region of stripe 14. If, in a region remote from the stripe 14, the p-n junction is bounded only on one side by the higher band-gap material, the current confinement provided by the p-n junction will be less effective than if it were bounded on both sides by the higher band-gap material. It is for this reason that it is preferred to arrange for the p-n junction to be everywhere, except at the boundary of the stripe 14, bounded on both sides by the higher band-gap material. Normally the higher band-gap material of the lower layer 12 will be grown on a GaAs substrate, in which case the zinc diffusion must not be allowed to take the p-n junction right through the lower layer 12 and into the substrate. If the p-n junction were to penetrate the substrate material, it would have the effect of providing another region of current confinement in parallel with that of the stripe 14. If the active layer was made of GaAs, the current confinement regions would have similar impedances; but if the active layer were to contain some AlAs, the region of the p-n junction in the substrate material would have the lower impedance, and hence would present a kind of short-circuit across the stripe 14.

Figure 2A:
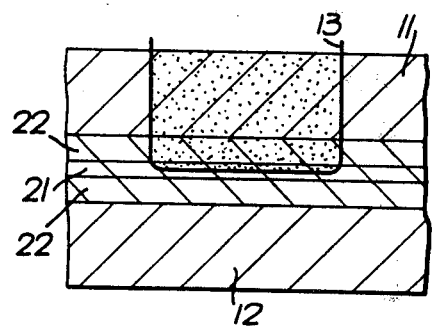
FIGS. 2a, 2b, 2c depicts the central portion of three further variants of double heterostructure laser.
Figure 2B:
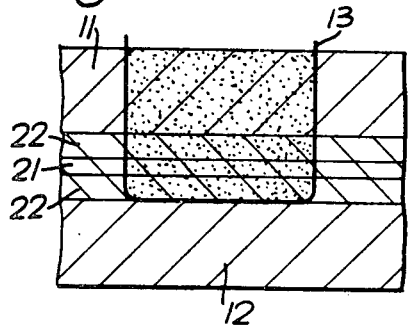
Figure 2C:
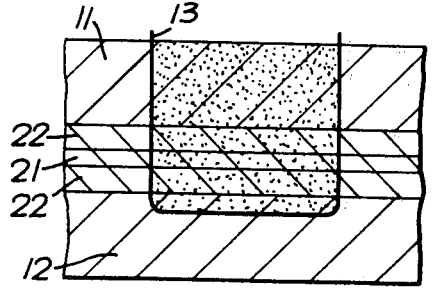

Referring to FIGS. 2a, 2b and 2c the active layer does not necessarily have to be of uniform composition, but may, for instance for reasons set out in British specification Ser. No. 1,263,835 (G. H. B. Thompson 11) have a central layer of $Ga_{1-x1}Al_{x1}As$ sandwiched between two layers 22 of $Ga_{1-x3}Al_{x3}As$, all three layers having a lower band-gap than that of the higher band-gap layers 11 and 12 (i.e. $x_2 > x_3 > x_1 > 0$). In a typical structure $x_1 = 0.05$, $x_3 = 0.1$, and $x_2 = 0.4$.

Laser structures according to the present invention in which the p-n junction has been translated into the higher band-gap layer underlying the active layer can be made using the process steps that are set out in the U.S. Pat. No. 4,011,113, and that involves the growth of a doped epitaxial layer doped with a mobile dopant that is to be subsequently diffused into the under lying semiconductive material. The preferred self-limiting etch is an electrochemical etch using tri-ethanolamine that is described hereinafter. These same process steps can also be used in the manufacture of laser structures according to the present invention in which the rib does not contribute significantly to optical guidance of the laser radiation in the lateral direction. However, in both instances, for reasons set out above concerning the mobility of zinc in diffusion processes, it is preferred to use a different set of process steps now to be described with particular reference to FIGS. 3a to 3j and to FIG. 4.

figs. 3a to 3i depict successive stages in one method of making a laser according to the present invention. The laser is constructed from a slice (FIG. 3a) consisting of five layers 31 to 35 epitaxially grown upon a substrate 30 of n-type GaAs, typically having a carrier concentration of about $10^{18} cm^{-3}$.

The active layer is layer 32, and is made of n-type $Ga_{1-x_1}Al_{x_1}As$, where $x_1$ is typically 0.05. The choice of carrier concentration for this layer is a compromise. A high carrier concentration is desirable because this produces good electron injection into that portion of the layer which is later going to be converted into p-type material. However, a high carrier concentration also produces a large refractive index difference, and for many applications this is undesirable because an increase in index difference requires the use of a corresponding reduction in stripe width in order to maintain single mode operation. With an active layer typically between 0.1 and 0.5 μm, thick, a carrier concentration of the order of $5 \times 10^{17} cm^{-3}$ may be chosen for a stripe width of about 3 μm.

A similar carrier concentration of about $5 \times 10^{17} cm^{-3}$ may be used for the upper and lower higher band-gap layers. These two layers are provided by layers 33 and 31 respectively. Both layers are made of $Ga_{1-x_2}Al_{x_2}As$, where $x_2$ is typically 0.35, and both are made of n-type material. Layer 31 is typically a relatively thick layer, typically 3-4 μm thick, so as to provide a substantial margin for error in the termination of the subsequent p-type diffusion without risk of the p-n junction penetrating into the underlying substrate 30. If desired, the carrier concentration of this lower layer 31 may be increased thereby tending to arrest the translation of the p-n junction at the upper surface of this layer.

Layers 34 and 35 are both of p-type material. Layer 34 is made of the higher band-gap material and, except for conductivity type doping, typically has the same composition as the underlying upper higher band-gap layer 33. The carrier concentration of layers 33 and 34 are also typically about the same value, while that of layer 35, which is provided for making contact with, has a higher carrier concentration to facilitate contacting, and typically has a carrier concentration of about $2 \times 10^{19} cm^{-3}$. Layer 35, which is made of GaAs, is typically about 1 μm thick. Layers 33 and 34 are together also about 1 μm thick, or slightly greater, in order to provide adequate spacing of the optically absorbing high carrier concentration layer 35 from the active layer without introducing excessive series resistance.

The top surface of the slice is provided with a layer 36 (FIG. 3b) of porous silica, approximately 0.2 μm thick, deposited by the oxidation of silane in air at between 400° and 500° C. The layer is then doped with zinc. For this purpose a method of doping may be used which was originally devised for diffusion of zinc directly into gallium arsenide. According to this method a quantity of zinc is dissolved in gallium, and to this is added an appropriate amount of gallium arsenide. The relative quantities of gallium and gallium arsenide are chosen to give the gallium to arsenic ratio that, at the temperature at which the diffusion is to be performed, is suitable for liquid phase epitaxial growth of material of the same composition as that underlying the porous layer.

This source material is placed at one end of a silica capsule and the slice at the other. A small piece of silicon is placed in the capsule which is then evacuated and sealed. The silicon is included as a kind of 'getter' for any evolved oxygen. Diffusion is then promoted by placing the sealed capsule in a furnace arranged to heat the source material end to a slightly higher temperature than the end containing the slice. This diffusion is typically performed at about 750° C., and constitutes the first stage of a two stage diffusion process. After the first stage of the diffusion has been completed, any zinc that has diffused into the exposed surface of the substrate is removed by etching or polishing.

Next, standard photolithographic techniques are used to remove all the silica layer except for a stripe 37, typically 3 μm wide, which is protected by a stripe 38 (FIG. 3d) of photolithographic mask material. (For illustrative convenience FIGS. 3d–3i depict a slice having only one stripe 38. Only one stripe is necessary for the manufacture of a single laser, but in accordance with normal semiconductor device manufacture practice, it is generally preferred to make lasers in batches, and for this purpose a slice will normally be provided with a set of stripes in order to allow the manufacture of an array of lasers on a single slice.)

Figure 3:
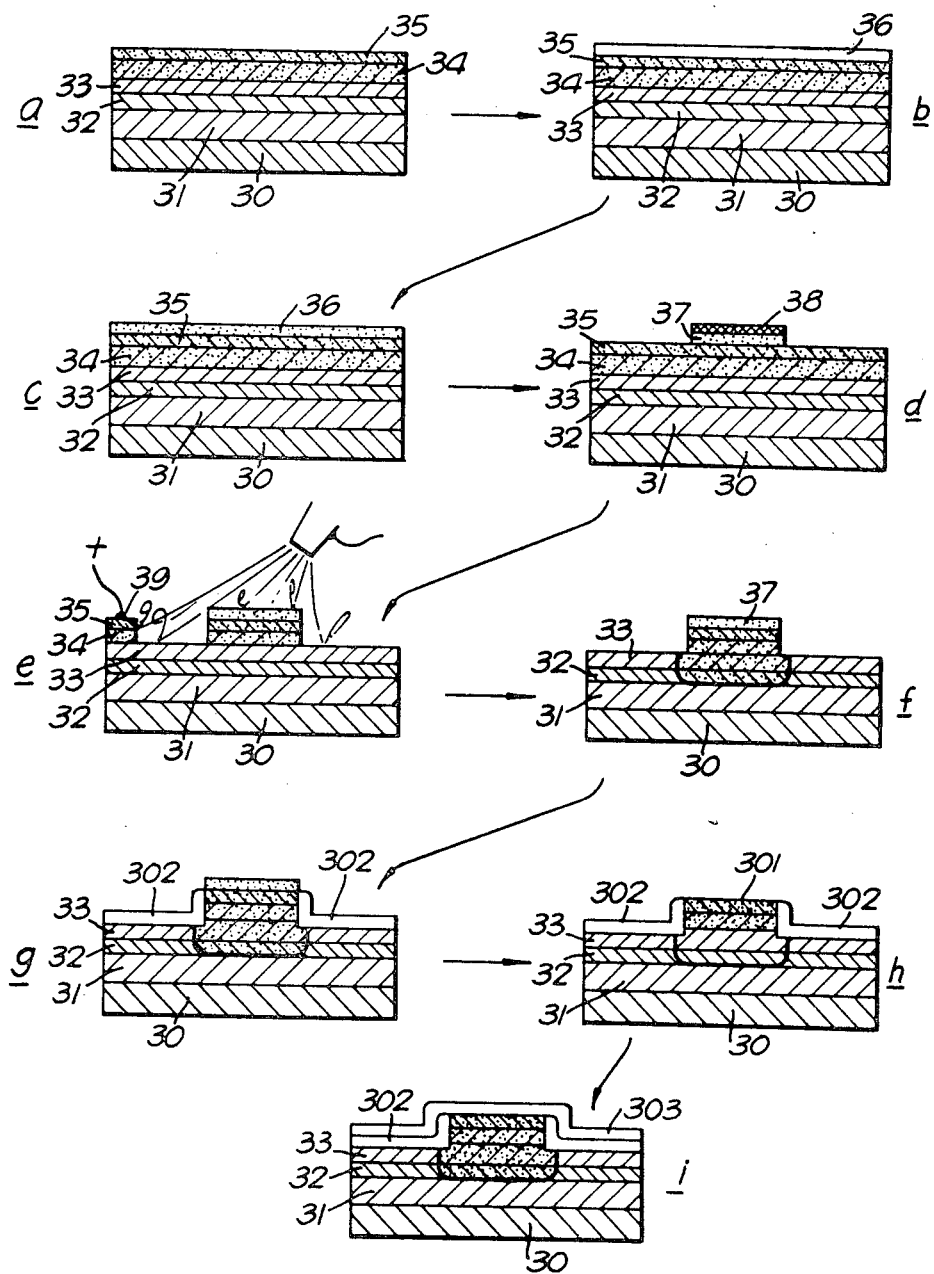
FIGS. 3a to 3i depict successive stages in the manufacture of a laser.

It is then preferred to etch away the areas of p-type material exposed by the removal of the silica (FIG. 3e). Removal of this material limits the lateral spread of zinc in the subsequent second stage of the diffusion process, and also removes the wings of the p-n junction, thereby more effectively confining the current flow across the junction to the region required. A preferred etching method is one that will etch p-type $Ga_{1-x}Al_xAs$. ($x \geq o$) significantly faster than n-type $Ga_{1-x}Al_xAs$. A known self-limiting electrochemical etching method of this type that uses a potassium hydroxide solution as the electrolyte for etching p-type GaAs was tried, but was found to be difficult to operate satisfactorily in the etching of $Ga_{1-x}Al_xAs$ containing a significant proportion of aluminium. Accordingly a new etching method was devised specifically for the self-limiting etching of semiconductor material containing aluminium, and in particular for etching gallium aluminium arsenide. This employs tri-ethanolamine as the etchant, and is used in a kind of electrochemical etching cell in which the semiconductor is made one electrode and platinum is used as the other electrode. The preferred operation of this cell is slightly different from that previously used for etching GaAs in that, instead of using an external voltage source to drive a current through the etching solution, either no external voltage is used, or an external voltage is used to backoff the voltage produced by the cell itself. A reduced voltage is found to give improved selectivity. A typical set-up for the cell is depicted in FIG. 4. A workpiece 40 of $Ga_{1-x}Al_xAs$ containing one or more exposed regions of p-type material which is desired preferentially to etch is mounted on a substrate 41, which may be a glass microscope slide, provided with a pair of conductive tracks 42 to both of which electrical connection is made by way of a lead 43. This forms one electrode of the cell. The tracks 42 extend to beneath the workpiece 40 and are electrically connected with its edges. These connections and the lower part of the tracks are masked with black wax 44. An adjustable mount 45 is used to locate the workpiece about half a centimeter in front of the output jet 46 of a centrifugal pump 47 of p.t.f.e. The other electrode of the cell is provided by a platinum wire 48 terminating in a coil 49 inside the jet so that bubbles of hydrogen involved at its surface are continuously dislodged by the circulation of electrolyte through the pump, thereby tending to prevent the build-up of an excessive hydrogen over-voltage. The electrolyte 401 is an aqueous solution of triethanolamine to which has been added an electrical conductivity enhancing material, such as potassium chloride. A typical solution contains 3 to 5% triethanolamine and 2% potassium chloride. The electrolyte is contained in a beaker 402, and the pump 47 is lowered until its inlet port 403 is beneath the level of electrolyte while the jet 46 and the workpiece remain above this level. The open circuit voltage of the cell is typically about 400 mv. External connection between the two electrodes of the cell is made by way of a resistor 404, enabling the cell current to be measured, and optionally by way of an adjustable backing-off voltage source 405 in series with the resistor 404. Etching is found to proceed satisfactorily with a current density at the portion of the slice surface being etched in the region of 0.5 mA cm$^{-2}$, and is found to be highly selective provided that the cell is kept in darkness. In daylight selectivity is virtually destroyed, presumably because the n-type material can be attacked in the presence of minority carriers derived from photoexcitation.

In view of the small voltages involved in this etching process it is necessary to have a good ohmic contact. This contact is represented symbolically at 39 in FIG. 3c. The positioning of the contact is important in relation to the operation of the etching process in that it is desirable to avoid a geometry that could lead to the etching process exposing the underlying n-type material in such a way as to leave islands of p-type material electrically isolated from the contact. If an island of this sort is created it will cease to be etched. In the case of a slice having a set (not shown) of stripes 37, it is preferred to deposit by vacuum evaporation gold-zinc alloy, suitable for making an alloyed contact, in two strips (not shown) across the ends of the strips 37. The slice is heated to form alloyed contacts, and then the slice is secured to a suitable support, such as a microscope slide (not shown in FIG. 3e), and connection made between the alloyed contacts and an electrically conductive track on the microscope slide. Electrically conductive paste (not shown) used for making this electrical connection can also serve to secure the slice to its support. The contact, the paste, and the conductive track on the microscope slide, are then masked from the electrolyte with wax. When the etching has been completed the two alloyed contacts are removed from the slice by cleaving.

The next processing step consists of the second stage of the zinc diffusion process (FIG. 3f) in which the zinc in the silica stripe 37 is diffused into the underlying semiconductive material. This is to translate the bottom of the p-n junction 300, originally lying between layers 33 and 34, right through layer 33 and into, or through, the underlying active layer 32. This second stage of diffusion is typically carried out at about 850° C., and may be carried out either in an enclosed space in a graphite container in a hydrogen atmosphere, or in an evacuated sealed silica capsule like that used for the first stage. If a sealed capsule is used, it is provided with gallium and arsenic in appropriate proportions to produce a balanced atmosphere at the new diffusion temperature. As before, some silicon is included as a getter, but this time there is no source of zinc other than that provided by the residual portions of the silica layer 36 in the slice.

Following the second stage of the zinc diffusion, it is desired to provide an electrical contact layer for the p-type material. This contact layer must make contact with the rib 301 of the semiconductor material, which at this stage is masked with silica, but must not be allowed to make contact with the semiconductive material that is currently exposed. The existing silica could be stripped off and a fresh mask applied. This fresh mask would have to be either a permanent mask selectively masking the exposed n-type material, or a temporary mask masking the p-type material while the n-type is provided with insulation. In either case there are problems of mask registration, and these are particularly severe if the stripe width is fine. Accordingly it is preferred the avoid the requirement of remasking by using the existing silica itself as temporary mask material.

The exposed n-type material of the slice is provided with an electrically insulating anodic layer 302 (FIG. 3g) by anodisation in a suitable electrolyte, such as equal parts glycol and a 3% aqueous solution of ammonium citrate. This anodisation is typically carried out at about 100 volts, with a series resistor adjusted to provide a current density at the slice surface in the region of 10 mA cm. Next the silica is selectively removed (FIG. 3h) by radio frequency plasma etching, in, for instance, sulphur hexafluoride. A convenient form of apparatus for this plasma etching is that described in the British patent specification Ser. No. 1,461,636 (R. A. H. Heinecke-R. C. Stern 8-5). Any residue left from the plasma etching may be cleaned off by immersing the slice in bromine methanol and rinsing in methanol. As an additional or alternative cleaning step, the exposed surface 301 of the rib may be anodised at a low voltage typically of the order of 25 volts, and then the resulting anodised layer (not shown) removed by etching. This removal of the anodised layer must not involve removal of the whole thickness of the anodised layer 302. An etch which will etch anodised GaAs faster than anodised $Ga_{1-x}Al_xAs$ ($x>o$) is helpful, but not essential because the latter is thicker on account of having been made at a much greater voltage. A dilute ammonium hydroxide etch or a dilute hydrochloric acid etch are both suitable etches for this purpose.

After the surface 301 of the rib has been cleaned the slice is ready for the provision of a top contact layer 303. (FIG. 3i) which is formed by vacuum evaporation of titanium followed by gold.

The rib in the top surface of the laser can have either or both of two functions in addition to that of providing a top contact of limited area. If the surfaces on either side of the rib are sufficiently close to the active layer, having regard to the width of the rib, then the rib will provide a significant measure of optical guidance of the laser radiation in the lateral direction. With a 3 $\mu$m wide rib this situation occurs when the thickness of layer 33 is such as to make the semiconductive material surfaces on either side of the rib between 0.4 and 0.5 $\mu$m above the middle of the active layer. On the other hand, by increasing this distance by about a further 0.3 $\mu$m, the lateral optical guidance provided by the rib is reduced to an insignificant value. The other potential function of the rib concerns the limitation of lateral diffusion of the mobile dopant. The top contact needs to be spaced some distance from the active layer because it needs to contact a region with a high carrier concentration, and such regions are optically lossy. If the rib is defined before the diffusion of the mobile dopant there can be no lateral diffusion of the dopant within the depth of the rib, and hence lateral diffusion occurs only in the restricted region beneath the bottom of the rib.

Variants of the above described process are possible. Thus one can omit layer 35 of highly doped p-type GaAs, provided firstly that the zinc diffusion provides an adequately high carrier concentration at the surface to enable the contact layer 303 to make a satisfactory contact, and secondly that the high carrier concentration is sufficiently far removed from the active layer so as not to introduce excessive free-carrier optical absorption. The layer 34 of p-type $Ga_{1-x}Al_xAs$ ($x \geq o$) can safely be omitted provided that, if the p-type layer 35 is provided the portions not protected by the silica masking strip are removed. If these portions are not completely removed, then in the regions beyond the stripe there is a part of the p-n junction where it is bounded on one side by the lower band-gap material of layer 35, and this is liable to produce unwanted leakage current. Complete removal of the unwanted p-type material is not difficult to ensure because the self-limiting electrolytic etch is found to be highly selective, and because any residual p-type material close to the surface is going to be incorporated in the anodised layer created by the resulting anodisation process step described with particular reference to FIG. 3g.

We claim:

1. A method of making a double heterostructure injection laser of III–V material, the method including the steps of:
   (a) forming by epitaxial growth a double heterostructure with an active layer of lower bandgap material sandwiched between upper and lower layers of higher bandgap material wherein all three layers exhibit one conductivity type,
   (b) depositing on the upper surface of the double heterostructure a porous host layer for a conductivity type determining dopant of the opposite conductivity type and of greater mobility than that used in the formation of the three layers of the double heterostructure, said porous layer being made of a semiconductive material other than a III–V material,
   (c) diffusing said dopant into said porous layer,
   (d) selectively removing all of said porous layer with the exception of a stripe,
   (e) selectively removing a surface region of the upper surface of said double heterostructure exposed by the selective removal of the porous layer so as to leave a rib on said double heterostructure underlying the stripe of porous material,
   (f) diffusing some of said dopant from the porous stripe into the underlying double heterostructure to provide a p-n junction that in the region underlying the rib has been translated at least into the active layer and not more than through the active layer and into the lower layer of higher bandgap material, and
   (g) removing the stripe of porous material.

2. A method as claimed in claim 1 wherein said selective removal of the surface region of semiconductive material is to a depth that, having regard to the width of the rib, in such that the contribution to optical guidance in the laser cavity in the lateral direction provided by the rib is insignificant.

3. A method as claimed in claim 1 wherein the diffusing of the mobile dopant is terminated before the p-n junction penetrates the heterojunction between said active and lower layers.

4. A method as claimed in claim 1 wherein the diffusion of the mobile dopant is terminated after the p-n junction penetrates the heterojunction between said active and lower layers.

5. A method as claimed in claim 4 wherein said porous layer is of silica and is deposited by the oxidation of silane in air.

6. A method of making a double heterostructure injection laser of III–V material, the method including the steps of forming by epitaxial growth a double heterostructure with an active layer sandwiched between upper and lower layers of higher bandgap material wherein all three layers exhibit one conductivity type, of depositing on the upper surface of the double heterostructure a porous host layer for a conductivity type determining dopant of the opposite type and of greater mobility than that used in the formation of the three layers of the double heterostructure, said porous layer being made of a semiconductor material other than a III–V material, of diffusing said dopant into said porous layer, of selectively removing all of said porous layer with the exception of a stripe, of selectively removing a surface region of the upper surface of said double heterostructure exposed by the selective removal of the porous layer so as to leave a rib on said double heterostructure underlying the stripe of porous material, of diffusing some of said mobile dopant from the porous stripe into the underlying double heterostructure to provide a p-n junction that in the region underlying the rib has been translated into the active layer or through the active layer and into the lower layer of higher bandgap material, of removing the stripe of porous material, and wherein said selective removal of the surface region of the upper surface of said double heterostructure is to a depth that, having regard to the width of the rib, the rib provides a significant contribution to optical guidance in the lateral direction.

7. A method as claimed in claim 6 or 1 wherein said three layers having the same conductivity type are grown as n-type layers.

8. A method as claimed in claim 7 wherein zinc is used as the mobile dopant.

9. A method as claimed in claim 7 wherein magnesium is used as the mobile dopant.

10. A method as claimed in claim 6 or 1 wherein the double heterostructure is grown in $Ga_{1-x}Al_xAs$ ($x \geq o$).

11. A method as claimed in claim 6 or 1 wherein the couble heterostructure is grown in $Ga_{1-x}In_xAs_{1-y}P_y$ ($X \geq o \leq y$).

12. A method as claimed in claims 6 or 1, wherein said porous layer is a layer of silica.

13. A method as claimed in claim 12, wherein after said diffusion, the stripe of silica is used as a mask for the rib, while the remainder of the top surface of the semiconductive material of the laser is anodized to provide a layer of electrical isolation.

14. A method as claimed in claims 6 or 1, wherein said three layers having the same conductivity type are grown as p-type layers.

15. A method as claimed in claims 6 or 1, wherein the active layer is grown as a triple layer structure having a small band-gap layer sandwiched between two layers of greater band-gap material, which greater band-gap layers have a band-gap less than that of said upper and lower layers of higher band-gap material.

16. A method as claimed in claim 15, wherein the double heterostructure is grown in a ternary compound semiconductor system.

17. A method as claimed in claim 15, wherein the double heterostructure is grown in a quaternary compound semiconductor system.

18. A method as claimed in claim 15, wherein the rib structure is formed at least in part by etching through p-type material to expose underlying n-type material using a self-limiting electrochemical etch.

19. A method as claimed in claim 18, wherein the electrolyte used for the electrochemical etching is an aqueous solution of triethanolamine.

20. A method as claimed in claim 13 wherein after said anodisation the silica stripe is selectively removed by plasma etching.

21. A method as claimed in claim 20 wherein the silica is plasma etched in the presence of sulphur exachloride, 22. A method as claimed in claim 20 wherein zinc is diffused into the porous layer to act as a mobile dopant.

23. A method as claimed in claim 20 wherein zinc is diffused into the porous layer to act as a mobile dopant and wherein said diffusion into the porous layer is performed in a sealed capsule containing a melt whose composition is such that, at the temperature of diffusion into the porous layer, it is suitable for liquid phase epitaxial growth of material of the same composition as that of the material underlying the porous layer.

24. A method as claimed in claim 23 wherein said diffusion of some of said mobile dopant from the porous stripe into the underlying semiconductive material is performed in a sealed capsule containing a melt whose composition is such that, at the temperature of said diffusion into the underlying semiconductive material, it is suitable for liquid phase epitaxial growth of material of the same composition as that of the material underlying the porous layer.

25. A method as claimed in claim 18 wherein the drive voltage for the electrochemical etching is provided by all or part of the voltage developed by the electrochemical cell itself.

* * * * *